(12) United States Patent
Kanzaki et al.

(10) Patent No.: US 9,608,350 B2
(45) Date of Patent: Mar. 28, 2017

(54) ELECTRONIC EQUIPMENT UNIT AND MANUFACTURING MOLD ASSEMBLY THEREOF

(71) Applicant: Mitsubishi Electric Corporation, Tokyo (JP)

(72) Inventors: Shozo Kanzaki, Tokyo (JP); Fumiaki Arimai, Tokyo (JP); Hiroyoshi Nishizaki, Tokyo (JP); Masato Nakanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 75 days.

(21) Appl. No.: 14/804,616

(22) Filed: Jul. 21, 2015

(65) Prior Publication Data

US 2016/0261059 A1 Sep. 8, 2016

(30) Foreign Application Priority Data

Mar. 2, 2015 (JP) .................................. 2015-039807

(51) Int. Cl.
*H05K 3/28* (2006.01)
*H05K 1/09* (2006.01)
(Continued)

(52) U.S. Cl.
CPC ........... *H01R 12/721* (2013.01); *H01R 13/03* (2013.01); *H05K 1/0298* (2013.01); *H05K 1/09* (2013.01);
(Continued)

(58) Field of Classification Search
CPC ........ H05K 3/284; H05K 1/0298; H05K 1/09; H05K 2203/1327; H05K 3/28; H01R 12/721
(Continued)

(56) References Cited

U.S. PATENT DOCUMENTS 5,244,840 A * 9/1993 Kodai .............. G06K 19/07724
235/492
5,717,573 A 2/1998 Sakurai
(Continued)

FOREIGN PATENT DOCUMENTS

JP 8-58275 A 3/1996
JP 2001-344587 A 12/2001
JP 2010-67773 A 3/2010

*Primary Examiner* — James Harvey
*Assistant Examiner* — Matthew T Dzierzynski
(74) *Attorney, Agent, or Firm* — Sughrue Mion, PLLC; Richard C. Turner

(57) ABSTRACT

An electronic equipment unit includes a multi-layer circuit board. A part arrangement region on which circuit parts are mounted and a terminal region are provided on the multi-layer circuit board. The part arrangement region is encapsulated with resin. An outline region is formed from a solder resist film surrounding the part arrangement region to prevent the resin from flowing into the terminal region. A non-solder resist region is provided so as to surround the outline region and formation of the solder resist film is inhibited in the non-solder resist region. A clamp abutting surface which is pressed by a mold and surrounds the terminal region and thereby prevents the resin from flowing into the terminal region is a partial region of the multi-layer circuit board where a surface layer circuit pattern is absent.

8 Claims, 4 Drawing Sheets

(51) Int. Cl.
    *H01R 12/72*     (2011.01)
    *H05K 1/02*      (2006.01)
    *H01R 13/03*     (2006.01)
    *H01R 13/52*     (2006.01)
    *H01R 24/60*     (2011.01)
(52) U.S. Cl.
    CPC ........... *H05K 3/28* (2013.01); *H01R 13/5216* (2013.01); *H01R 24/60* (2013.01); *H05K 2203/1327* (2013.01)
(58) Field of Classification Search
    USPC ........................................................ 361/737
    See application file for complete search history.

(56) References Cited

U.S. PATENT DOCUMENTS

| 8,923,008 | B2* | 12/2014 | Yoshikawa | H05K 1/188 174/257 |
| 2001/0025721 | A1 | 10/2001 | Maeda et al. | |
| 2015/0257274 | A1* | 9/2015 | Kusama | H05K 1/185 174/260 |

* cited by examiner

ELECTRONIC EQUIPMENT UNIT AND MANUFACTURING MOLD ASSEMBLY THEREOF

BACKGROUND OF THE INVENTION

Field of the Invention

The present invention relates to an electronic equipment unit chiefly formed of a circuit board on which electronic parts are mounted and which has a re-attachable connection terminal to establish an electrical connection with an off-board device, and more particularly, to improvements of an electronic equipment unit having a resin encapsulation structure and a manufacturing mold assembly thereof.

Description of the Related Art

There is an electronic control device formed by providing an external connection connector to an end portion of a circuit board on which electronic parts are mounted and integrally molding all the components with encapsulation resin.

For example, PTL 1 (JP-A-2010-67773 (FIG. 1, Abstract, and paragraph 0002)) discloses an electrical and electronic control device and a manufacturing method thereof. The disclosed invention is applied to an electrical and electronic control device mounted to an automobile where it is required to protect a wiring board and electronic parts mounted on the wiring board by preventing the entry of water and a corrosive gas. A highly-reliable electrical and electronic control device capable of suppressing a decrease in productive efficiency due to a size increase of an electronic circuit board and a manufacturing method thereof can be obtained by performing the following steps as depicted in FIG. 1: a step of mounting electronic parts 1a and 1b on a wiring board 2; a step of encapsulating the electronic parts 1a and 1b mounted on the wiring board 2 with heat-curable resin 5; a step of mounting an external connection terminal 3 which electrically connects an electronic circuit on the wiring board 2 and an external electronic circuitry system; and a step of integrally encapsulating the wiring board 2 and the previously rein-encapsulated electronic parts 1a and 1b with heat-curable resin 7.

Also, there is an IC card formed by providing external connection card edge terminals to an end portion of a circuit board on which electronic parts are mounted and integrally molding substantially all the components except for a card edge terminal region.

For example, PTL 2 (JP-A-2001-344587 (FIG. 1 and Abstract)) discloses a printed-wiring board, an IC card module using the same, and a manufacturing method of the same. Referring to FIG. 1, an IC card module 10 is formed of a printed-wiring board 11 having wiring 12 printed on a top surface, semiconductor devices 13 mounted on the printed-wiring board 11, wires 14 connecting the wiring 12 and the semiconductor devices 13 to each other, chip parts 15, such as a resistor and a capacitor, and resin 16 encapsulating the semiconductor devices 13 and the wires 14. The semiconductor devices 13 and terminals 18 are provided on a substrate 17 at positions spaced apart from each other.

When an IC card manufactured using the IC card module 10 and an external device provided with an IC card slot are connected to each other, a connection can be established without a need to insert the semiconductor devices 13 into the slot when the terminals 18 are inserted into the slot. Hence, it becomes possible to manufacture an IC card having a structure that allows the semiconductor devices 13 to be unaffected by mechanical stress from the outside and heat from the external device.

Also, PTL 3 (JP-A-8-58275 (FIG. 2 and Abstract)) discloses a manufacturing method of an IC card, a connection method of an IC card, and an IC card. Referring to FIG. 2, both surfaces of a wiring board 12 equipped with electrical parts 14 are pinched by supporting pins 44 protruding from an inner surface of a mold. When a cavity 34 defined by an upper mold 30 and a lower mold 32 is filled with resin injected from a plunger 48, the wiring board 12 is forced to undergo deformation by a filling pressure. However, because the both surfaces of the wiring board 12 are pinched by the supporting pins 44 from the both sides, deformation and damage are prevented. After the wiring board 12 is released from the mold, portions abutted by the supporting pins 44 form holes from the surface of a resin layer to the wiring board 12. The wiring board 12, however, undergoes neither deformation nor damage caused by a filling pressure of a resin material during the molding.

CITATION LIST

Patent Literatures

PTL 1: JP-A-2010-67773 (FIG. 1, Abstract, and paragraph 0002)
PTL 2: JP-A-2001-344587 (FIG. 1 and Abstract)
PTL 3: JP-A-8-58275 (FIG. 2 and Abstract)

According to PTL 1 (JP-A-2010-67773), productive efficiency of the electronic control device is improved by encapsulating the wiring board 2 on which the electronic parts 1a and 1b are mounted with the heat-curable resin 5 first and then by mounting the external connection terminal 3 and integrally encapsulating all the components entirely with the heat-curable resin 7. However, because a connector 6 used herein as a circuit part has metal terminal pins, reflow soldering applied to the surface-mounted electronic parts 1a and 1b co-exists with the connector 6 to which reflow soldering is applied. Hence, there is a problem that such co-existence makes the fabrication sequence complex.

The same problem arises when the electronic parts and the connector are encapsulated with resin at a time. In a case where a surface-mounted connector is used, stress is applied to a surface-mounted portion when the external connecter is inserted and extracted. In order to prevent the occurrence of a disconnection error, the connector is required to have a direct removal structure.

On the contrary, PTL 2 (JP-A-2001-344587) does not use a connector having metal terminal pins. Hence, the number of parts can be reduced and a compact and inexpensive configuration can be achieved. However, the resin-encapsulated resin R is limited to an electronic part mounting region at the center of the board and a peripheral portion of the printed-wiring board 11 is bare. Hence, there is a problem that the bare portion has to be protected using a case 23.

Meanwhile, PTL 3 (JP-A-8-58275) does not require a protection cover for the IC card 10 because the wiring board 12, the electric parts 14, and a connector 28 are integrally molded. However, the connector 28 is connected to one side of the wiring board 12 via a pair of metal pieces 26. Hence, the connector 28 is required as a circuit part and the number of parts is increased. In addition, when encapsulated with resin, there is a risk that encapsulation resin enters into a space between the metal pieces 26 and the wiring pattern on the wiring board 12 and causes a contact failure. Further, the upper mold 30 and the lower mold 32 are configured so as to prevent deformation of the wiring board 12 by pinching the wiring board 12 using the supporting pins 44. However, because portions abutted by the supporting pins 44 form cavities, there is a problem that the electric parts 14 cannot be mounted in the vicinity of the surface abutted by the supporting pins 44.

SUMMARY OF THE INVENTION

A first object of the invention is to provide an electronic equipment unit of an inexpensive configuration capable of preventing cracking and separation of resin by improving adhesion between encapsulation resin and a circuit board and capable of making the encapsulation resin thinner by eliminating a need for attachment parts, such as a storing case.

A second object of the invention is to provide an electronic equipment unit that does not require a circuit board to have an external connection connector part and has a configuration such that prevents a leakage of resin on a conductive contact surface even when a molding pressure is increased.

An electronic equipment unit according to an aspect of the invention is an electronic equipment unit of a card edge terminal type including a plurality of copper foil pattern terminals pressed by external connection contact terminals in at least one of both surfaces at end portions on a first side and a second side parallel to the first side of a multi-layer circuit board. The multi-layer circuit board includes: apart arrangement region in which a plurality of circuit parts are connected with solder; an outline region which surrounds the part arrangement region and in which a solder resist film is formed; and a non-solder resist region which is further located outside of the outline region and in which formation of the solder resist film is inhibited. The copper foil pattern terminals connected to a plurality of the circuit parts are provided to at least one of the first side and the second side. A solder resist film is formed in the card edge terminal region which is a peripheral portion of the copper foil pattern terminals except for a conductive contact surface. The multi-layer circuit board and a plurality of the circuit parts are integrally molded with encapsulation resin which is heat-curable resin except for the card edge terminal region. The copper foil pattern terminals are formed on a surface layer through via holes by passing through the non-solder resist region by means of an inner layer pattern of the multi-layer circuit board. A clamp abutting surface which is pressed by a mold and surrounds the card edge terminal region and thereby prevents the encapsulation resin from flowing into the card edge terminal region is a partial region of the multi-layer circuit board where a surface layer circuit pattern is absent.

A manufacturing mold assembly for the electronic equipment unit according to another aspect of the invention is configured in such a manner so as to: pinch, between a pair of a lower mold and an upper mold opposing each other, the multi-layer circuit board including a plurality of the circuit parts mounted in the part arrangement region, the non-solder resist region provided on an outer side of the part arrangement region, and the card edge terminal region in which a plurality of the copper foil pattern terminals are formed and which is provided to at least one of two sides on an outer side of the non-solder resist region; and integrally mold the multi-layer circuit board and a plurality of the circuit parts except for the card edge terminal region with the encapsulation resin by press-injecting heat-curable resin melted by heating from an injection port provided to a boundary surface. A movable mold is provided to at least one of the lower mold and the upper mold and the movable mold includes a terminal relief recess to prevent the encapsulation resin from flowing into the card edge terminal region and presses the clamp abutting surface of the multi-layer circuit board using an outer peripheral portion of the terminal relief recess via a board thickness adjusting mechanism. The board thickness adjusting mechanism includes one of an air pressure adjusting mechanism, a liquid pressure adjusting mechanism, and a pressing elastic member to maintain a constant pressing pressure even when a thickness dimension of the multi-layer circuit board varies.

As has been described, the electronic equipment unit configured as above is formed by integrally molding a plurality of the circuit parts and the multi-layer circuit board with the encapsulation resin. Herein, a plurality of the copper foil pattern terminals are provided to an end portion of the multi-layer circuit board exposed from the encapsulation resin and the external connection contact terminals are pressed against the copper foil pattern terminals. The non-solder resist region is provided on the outer peripheral portion of the multi-layer circuit board and a region is provided between the card edge terminal region and the part arrangement region, in which region formation of a surface circuit pattern is inhibited and to which region the clamp abutting surface of the mold preventing the encapsulation resin from flowing into the card edge terminal region is provided.

Accordingly, it is not necessary to attach a board-side connector part including connection pins fit to the external connection connector to the multi-layer circuit board. Hence, there is an advantage that a connection to the external device can be established easily with a compact and inexpensive configuration.

Also, adhesion of the forming mold is improved by pressing the surface circuit pattern inhibiting region from the both sides. Hence, there is an advantage that the occurrence of a leakage of resin into the card edge terminal region can be prevented even when a molding pressure is increased. At the same time, because adhesion between the encapsulation resin and the outer peripheral portion of the multi-layer circuit board is improved, there is an advantage that separation of the resin and disconnection of the part terminal caused by remaining stress induced during the molding contraction can be prevented.

The periphery of the copper foil pattern terminals is covered with the solder resist film. Hence, there is an advantage that the copper foil pattern terminals seldom separate and scraping and hooking of the copper foil edge portions by the connector contact terminals can be prevented.

As has been described, the manufacturing mold assembly configured as above is applied to the electronic equipment unit formed by integrally molding a plurality of the circuit parts and the multi-layer circuit board with the encapsulation resin and by providing a plurality of the copper foil pattern terminals to an end portion of the multi-layer circuit board exposed from the encapsulation resin, so that external connection contact terminals are pressed against the copper foil pattern terminals. The movable mold having the board thickness adjusting mechanism and the terminal relief recess is provided to at least one of a pair of the upper and lower molds. The terminal relief recess prevents the encapsulation resin from flowing into the card edge terminal region.

Accordingly, even when a thickness dimension of the multi-layer circuit board varies, the outside of the card edge terminal region is pressed without any clearance by the movable mold, so that the encapsulation resin is prevented from flowing into the copper foil pattern terminal region in a reliable manner. Hence, there is an advantage that a compact electronic equipment unit with high contact reliability can be obtained.

The outer peripheral portion of the multi-layer circuit board is provided with the non-solder resist region and a region is provided between the card edge terminal region and the part arrangement region, in which region formation of a surface circuit pattern is inhibited.

Accordingly, the movable mold does not press on the wiring pattern but presses the surface of the multi-layer circuit board. Hence, there is an advantage that a leakage of the resin into the copper foil pattern terminal region hardly occurs.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
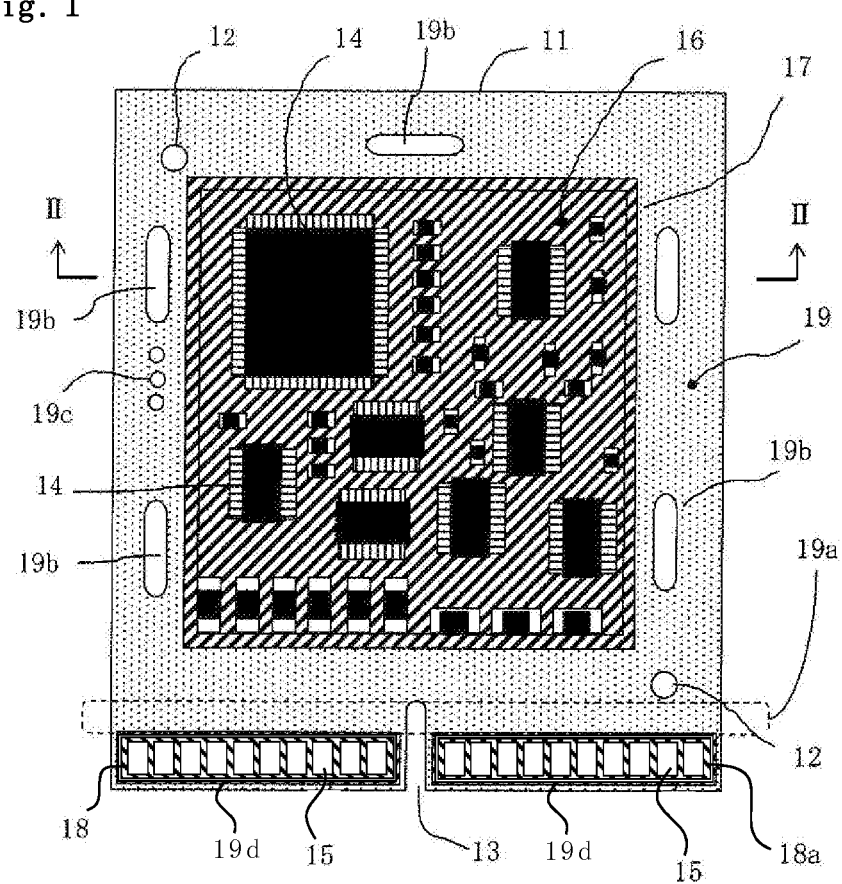
FIG. 1 is a plan view of an electronic equipment unit according to a first embodiment of the invention before resin encapsulation.

Hereinafter, respective embodiments of the invention will be described according to the drawings.

Same reference numerals denote same or equivalent portions in all the drawings (FIG. 1 through FIG. 7).

First Embodiment (1) Detailed Description of Configuration and Function

A configuration will be described first in detail by referring to FIG. 1 which is a plan view of an electronic equipment unit according to a first embodiment of the invention before resin encapsulation, FIG. 2 which is a cross section taken along the line II-II of FIG. 1 after resin encapsulation, and FIG. 3 which is a partial detailed view of FIG. 1 after resin encapsulation.

Figure 2:
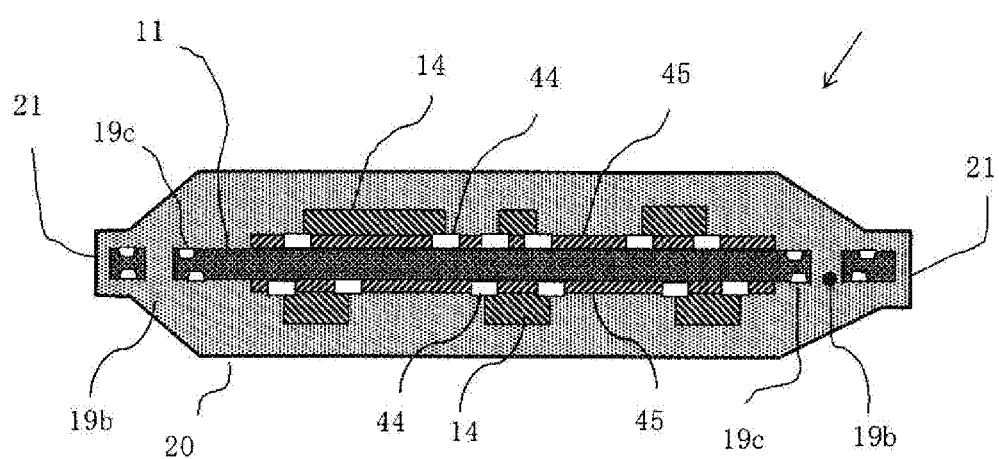
FIG. 2 is a cross section taken along the line II-II of FIG. 1 after resin encapsulation.

Referring to FIG. 1 and FIG. 2, an electronic equipment unit 10 is chiefly formed of a multi-layer circuit board 11 on which a plurality of circuit parts 14 are mounted. The multi-layer circuit board 11 is integrally molded with encapsulation resin 20 forming an outer resin body. A plurality of copper foil pattern terminals 15 are arranged in at least one of a front end portion and a rear end portion exposed from the encapsulation resin 20 (the front end portion alone in FIG. 1), so that the electronic equipment unit 10 is electrically connected to an external device via a connector 30 described below with reference to FIG. 4.

A pair of reference holes 12 and 12 is disposed on a diagonal line of the multi-layer circuit board 11. By using the reference holes 12 and 12 as reference points, positions of lands on which to mount the copper foil pattern terminals 15 and the circuit parts 14 are determined and attachment positions are also set with respect to a part mounting device that mounts the circuit parts 14 and a forming mold used for resin encapsulation using the encapsulation resin 20.

A cut portion 13 provided to the multi-layer circuit board 11 is provided when there are a large number of the copper foil pattern terminals 15 at an intermediate portion so as to divide the copper foil pattern terminals 15 into groups.

A plurality of the circuit parts 14 are mounted on a part arrangement region 16. A circuit pattern 44 (see FIG. 2) provided to this region is covered with a solder resist film 45 except for a solder surface.

A non-solder resist region 19 uncovered with the solder resist film 45 is provided along an outer periphery of the part arrangement region 16 via an outline region 17 covered with the solder resist film 45.

By making the non-solder resist region 19 solder-resistless, adhesion to the encapsulation resin 20 is improved. In addition, adhesion to the encapsulation resin 20 is improved further by forming a large number of fine surface sac holes 19c on a top layer surface of the non-solder resist region 19 by irradiating a carbon dioxide laser beam.

Also, the multi-layer circuit board 11 is provided with a plurality of two-side (front and back sides) connection holes 19b. Separation of the encapsulation resin 20 is prevented by connecting the encapsulation resin 20 on the two sides through the two-side connection holes 19b so as to form one body (see FIG. 2).

The encapsulation resin 20 is fused to form one body at both side surfaces of the multi-layer circuit board 11 by side-surface outline portions 21. Hence, separation of the encapsulation resin 20 by dividing to the two sides can be prevented.

A surface pattern inhibiting region 19a is provided between the non-solder resist region 19 and a card edge terminal region 18 in which a solder resist film 18a surrounding a plurality of the copper foil pattern terminals 15 is applied.

Figure 3:
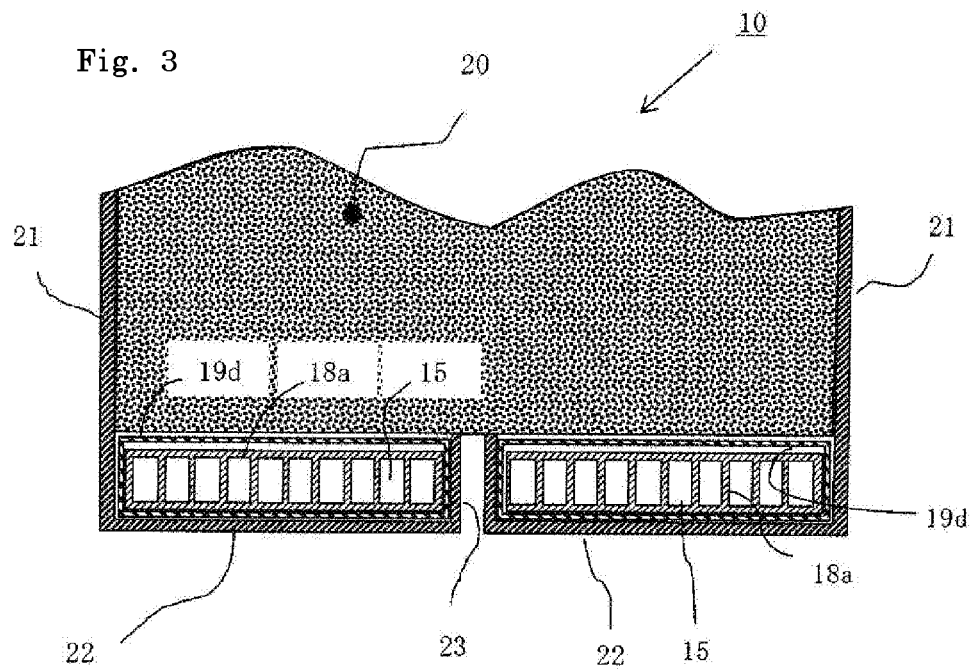
FIG. 3 is a cross section after resin encapsulation showing a lower half of FIG. 1 in detail.

Referring to FIG. 3 which is a partial detailed view of FIG. 1 after resin encapsulation, an outer side of the solder resist film 18a covering the outer periphery of the copper foil pattern terminals 15 forms a clamp abutting surface 19d pressed by a movable mold 103 described below with reference to FIG. 7. The clamp abutting surface 19d is a substrate surface of the multi-layer circuit board 11 on which a surface layer circuit pattern and preferably the solder resist film are absent, and serves as a contact surface which prevents the encapsulation resin 20 from flowing inside.

The solder resist film 18a within the card edge terminal region 18 may be extended to the clamp abutting surface 19d. It is preferable in this case to prevent the solder resist film 18a on the clamp abutting surface 19d from becoming inhomogeneous.

The encapsulation resin 20 is connected to the side-surface outline portions 21 and 21, an end-face outline portion 22, and an intermediate outline portion 23 which is an inner peripheral surface of the cut portion 13. Hence, the end face of the multi-layer circuit board 11 is covered with the encapsulation resin 20 along the entire circumference.

The configuration will now be described in detail by referring to FIG. 4 which is a cross section showing a state when a connecter is inserted into the cross section of FIG. 3, FIG. 5 which is a cross section taken along the line V-V of FIG. 4 after resin encapsulation, and FIG. 6 which is a partial detailed view of FIG. 1 before parts are mounted.

Figure 4:
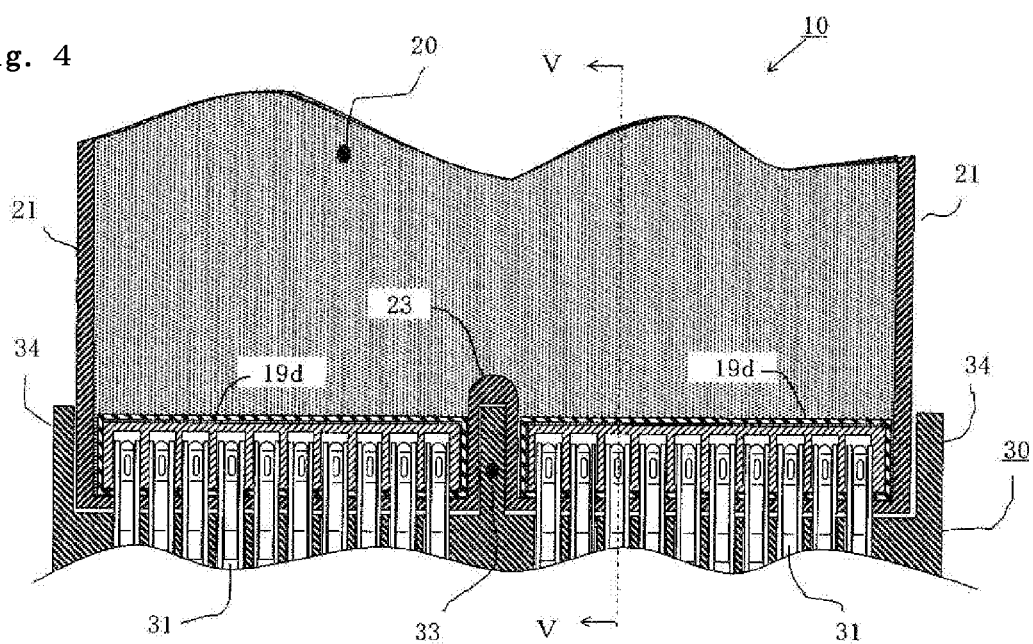
FIG. 4 is a cross section showing a state when a connecter is inserted into the cross section of FIG. 3.

Referring to FIG. 4, a plurality of contact terminal members 31 are arranged in and held by a connector 30. Each contact terminal member 31 is provided with a contact terminal 31a which comes into conductive contact with the corresponding copper foil pattern terminal 15 via an elastic member 31b (see FIG. 5).

In a case where the multi-layer circuit board 11 has the cut portion 13 and the intermediate outline portion 23 is formed from the encapsulation resin 20, the connector 30 includes an intermediate fitting portion 33. A right-left position of the connector 30 with respect to the multi-layer circuit board 11 is regulated by fitting the intermediate fitting portion 33 into the intermediate outline portion 23, so that the contact terminal 31a abuts on the copper foil pattern terminal 15 at an intermediate position.

In a case where there are a small number of the copper foil pattern terminals 15 and a width of the multi-layer circuit board 11 is narrow, the right-left position of the connector 30 with respect to the multi-layer circuit board 11 is regulated by fitting side-surface fitting portions 34 and 34 provided to the both sides of the connector 30 into the side-surface outline portions 21 and 21 provided to the both sides of the multi-layer circuit board 11.

Figure 5:
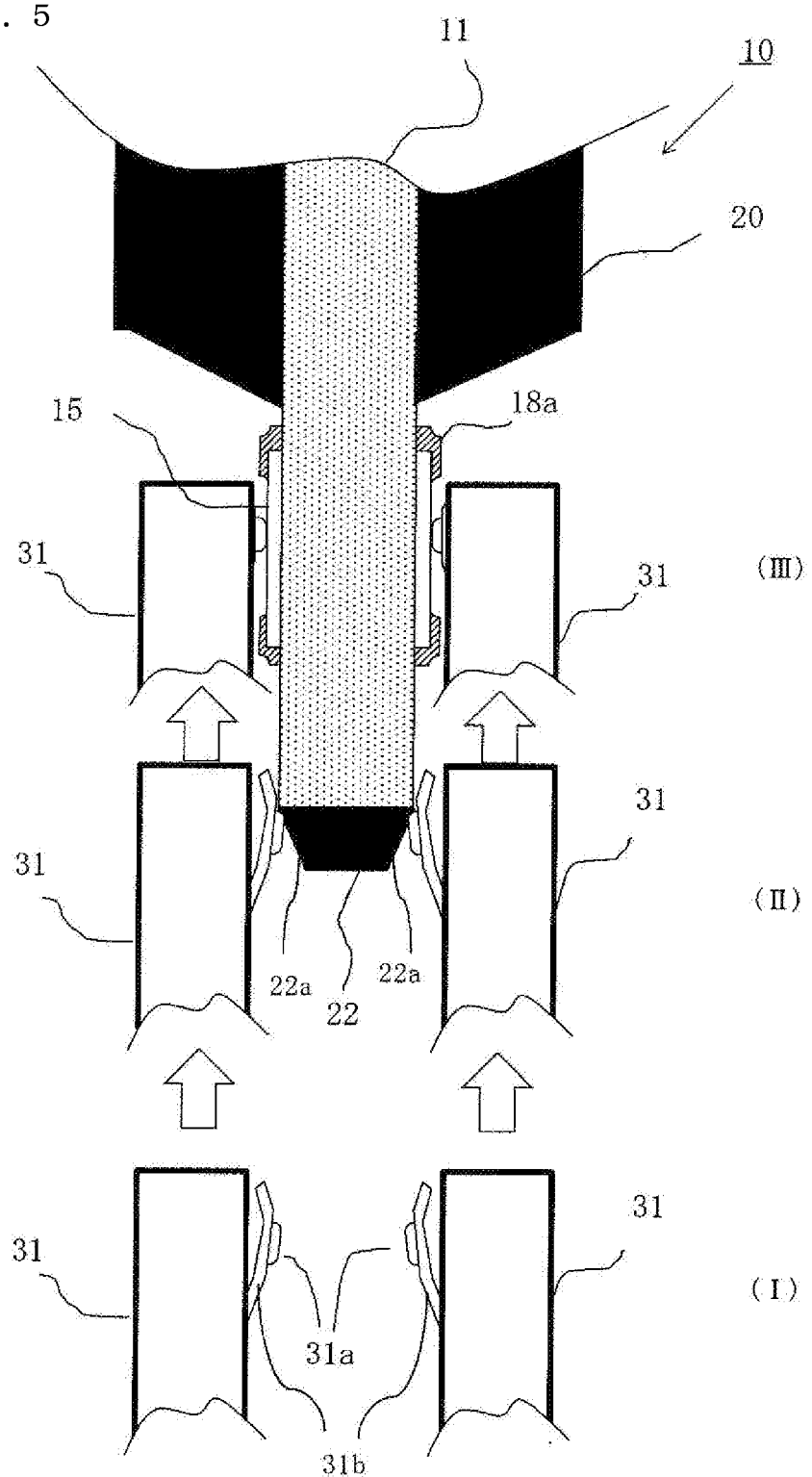
FIG. 5 is a cross section taken along the line V-V of FIG. 4 after resin encapsulation.

Referring to FIG. 5, the end-face outline portion 22 provided to the end face of the multi-layer circuit board 11 is of a trapezoidal shape in cross section. Accordingly, when the connector 30 is inserted, as is shown in the row II of FIG. 5, an interval between a pair of the contact terminals 31a is gradually increased (widened) along inclined portions 22a of the trapezoidal shape, thereby allowing the contact terminals 31a to be inserted naturally to the center position of the copper foil pattern terminal 15. The conductive contact surface of the copper foil pattern terminal 15 is brought into press-contact with the contact terminal 31a and connected to the connector 30.

The periphery of the copper foil pattern terminals 15 is covered with the solder resist film 18a. Hence, the copper foil pattern terminals 15 seldom separate and even when a slight amount of the encapsulation resin 20 enters into the card edge terminal region 18, the encapsulation resin 20 is blocked by the solder resist film 18a and fails to reach the copper foil pattern terminals 15.

Figure 6:
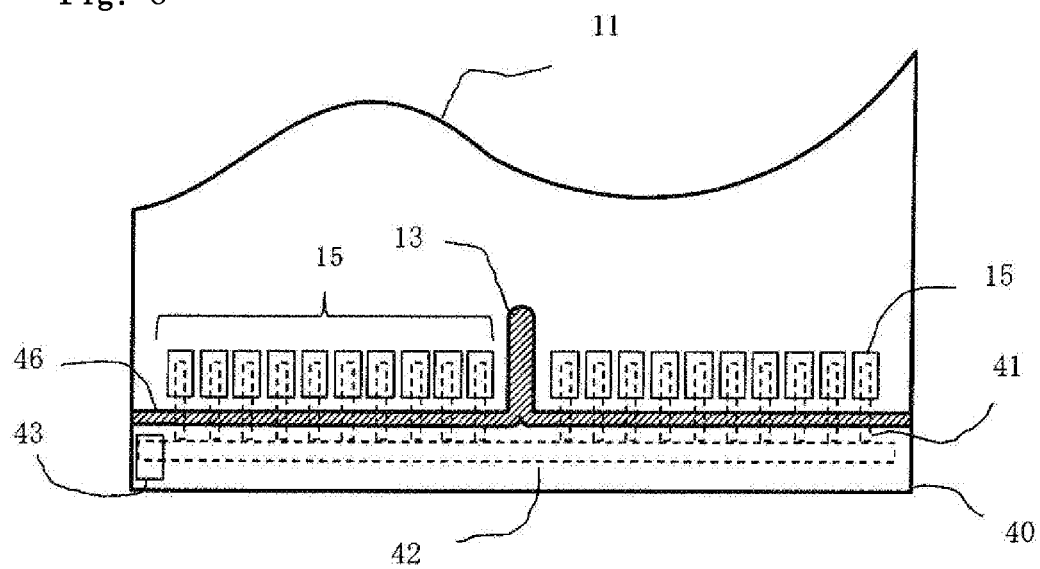
FIG. 6 is a partial detailed view of the lower half of FIG. 1 in a state before parts are mounted.

Referring to FIG. 6, a step of applying gold plating to the surfaces of the copper foil pattern terminals 15 will be described. This step is a pre-process of electronic equipment unit manufacturing.

In FIG. 6 which is a partial detailed view of FIG. 1 before parts are mounted, the multi-layer circuit board 11 has an edge-cut substrate 40 which is cut along a cut line 46 by a router which is an outer shape processing machine. A plurality of the copper foil pattern terminals 15 provided to the end face of the multi-layer circuit board 11 are connected to electrode terminals (not shown) of the circuit parts 14 via an internal layer pattern 41 and also interconnected by a connection pattern 42 in the edge-cut substrate 40 and therefore connected to an electrode terminal 43.

The inner layer pattern 41 and the copper foil pattern terminals 15 which are a surface layer pattern are electrically connected through unillustrated via holes.

An electrolytic plating power-supply voltage is applied to the electrode terminal 43 and gold plating is applied to the surfaces of the copper foil pattern terminals 15.

After the gold plating is applied, the edge-cut substrate 40 is cut along the cut line 46 and disposed of (cut and removed). At this point, the inner layer pattern 41 connecting the copper foil pattern terminals 15 and the connection pattern 42 is cut and a conducting portion is exposed to the end face of the multi-layer circuit board 11.

However, because the end-face outline portion 22 formed of the encapsulation resin 20 is provided to the multi-layer circuit board 11 as shown in FIG. 3, the occurrence of a conduction short circuit caused by corrosion in the exposed conducting portion can be prevented.

The above has described the first embodiment in which the copper foil pattern terminals 15 into which to insert the connecter 30 are provided to only one end of the multi-layer circuit board 11. In the case of this type, the electronic equipment unit 10 is inserted into the connector 30 fixed to the vehicle body and the both are formed into one piece using unillustrated hooking mechanism or fixing screws. The inner surface of the connector 30 is provided, for example, with an unillustrated water-proof packing so as to prevent the entry of water onto the conductive contact surface of the connector 30.

In contrast, there is a type in which the copper foil pattern terminals 15 are provided to the both ends like a multi-layer circuit board 11 of a second embodiment described below. In the case of this type, the electronic equipment unit 10 is fixed to the vehicle body with unillustrated solid ankle foot and a pair of the connectors 30 is inserted from the both sides. Then, the electronic equipment unit 10 and the connectors 30 are formed into one piece using unillustrated hooking mechanism or fixing screws. The inner surfaces of the connectors 30 are provided, for example, with unillustrated water-proof packings so as to prevent the entry of water to the conductive contact surfaces of the connectors 30.

(2) Main Points and Characteristics of First Embodiment

As is obvious from the description above, the electronic equipment unit 10 according to the first embodiment of the invention is an electronic equipment unit 10 of a card edge terminal type including a plurality of copper foil pattern terminals 15 pressed by external connection contact terminals in at least one of both surfaces at end portions on a first side and a second side parallel to the first side of a multi-layer circuit board 11. The multi-layer circuit board 11 includes: a part arrangement region 16 in which a plurality of circuit parts 14 are connected with solder; an outline region 17 which surrounds the part arrangement region 16 and in which a solder resist film is formed; and a non-solder resist region 19 which is further located outside of the outline region 17 and in which formation of the solder resist film is inhibited. The copper foil pattern terminals 15 connected to a plurality of the circuit parts 14 are provided to at least one of the first side and the second side. A solder resist film 18a is formed in the card edge terminal region 18 which is a peripheral portion of the copper foil pattern terminals 15 except for a conductive contact surface. The multi-layer circuit board 11 and a plurality of the circuit parts 14 are integrally molded with encapsulation resin 20 which is heat-curable resin except for the card edge terminal region 18. The copper foil pattern terminals 15 are formed on a surface layer through via holes by passing through the non-solder resist region 19 by means of an inner layer pattern 41 of the multi-layer circuit board 11. A clamp abutting surface 19d which is pressed by a mold and surrounds the card edge terminal region 18 and thereby prevents the encapsulation resin 20 from flowing into the card edge terminal region 18 is a partial region of the multi-layer circuit board 11 where a surface layer circuit pattern is absent.

The non-solder resist region 19 is provided with at least one of two-side connection holes 19*b* connecting the encapsulation resin 20 onboard front and back surfaces to each other and surface sac holes 19*c* allowing the encapsulation resin 20 on the board front and back surfaces to closely adhere to the board front and back surfaces, respectively.

As has been described, in relation to a second aspect of the invention, the non-solder resist region 19 provided on the outer periphery of the multi-layer circuit board 11 is provided with at least one of the two-side connection holes 19*b* and a plurality of the surface sac holes 19*c*.

Hence, there is a characteristic that the encapsulation resin surrounding the front and back surfaces of the multi-layer circuit board 11 can be further prevented from separating from the circuit board surfaces.

The encapsulation resin 20 extends to end-face outline portions 22 and 22 on the first side and the second side and side-surface outline portions 21 and 21 on a third side and a fourth side orthogonal to the first side and the second side and thereby surrounds the multi-layer circuit board 11 along an entire circumference. In a case where a plurality of the copper foil pattern terminals 15 are divided to two groups arranged on right and left sides and a cut portion 13 is provided to the card edge terminal region 18 of the multi-layer circuit board 11, an intermediate outline portion 23 extended from the encapsulation resin 20 is provided to an outer periphery of the cut portion 13. An external connection connector 30 is attached to a plurality of the copper foil pattern terminals 15. The connector 30 includes a plurality of contact terminal members 31 which come into conductive contact with the copper foil pattern terminals 15 and includes at least one of both-side fitting portions 34 and 34 which fit to the side-surface outline portions 21 and 21 and an intermediate fitting portion 33 which fits to the intermediate outline portion 23. Positional relations of the side-surface outline portions 21 and 21 and the intermediate outline portion 23 with respect to a plurality of the copper foil pattern terminals 15 are determined by using positioning reference holes 12 provided to the multi-layer circuit board 11 at diagonal positions as common reference points.

As has been described, in relation to a third aspect of the invention, the side-surface outline portions 21 and 21 or the intermediate outline portion 23 provided to the peripheral portion of the multi-layer circuit board 11 and a plurality of the copper foil pattern terminals 15 are disposed in reference to the reference holes 12 in the multi-layer circuit board 11 used as common reference points. The connecter 30 to be connected to the copper foil pattern terminals 15 includes the both-surface fitting portions 34 fit to the side-surface outline portions 21 or the intermediate fitting portion 33 fit to the intermediate outline portion 23.

Hence, there is a characteristic that even when an outer shape dimension of the multi-layer circuit board 11 has poor accuracy, by performing the integral molding with the encapsulation resin 20 by mounting the multi-layer circuit board 11 on the forming mold using the reference holes 12 in the multi-layer circuit board 11, accuracy of a relative position of the side-surface outline portions 21 or the intermediate outline portion 23 with respect to the copper foil pattern terminals 15 can be secured to allow the external connection connector 30 to fit to and come in contact with the copper foil pattern terminals 15 with good accuracy.

In a case where an arrangement of the copper foil pattern terminals 15 is relatively long, the cut portion 13 is provided to the multi-layer circuit board 11 to regulate movements in the right-left direction between the intermediate fitting portion 33 and the intermediate outline portion 23. Accordingly, deterioration of fitting accuracy due to expansion and contraction of the multi-layer circuit board 11 can be prevented. In a case where the arrangement of the copper foil pattern terminals 15 is relatively short, the need to provide the cut portion 13 to the multi-layer circuit board 11 can be eliminated by using the side-surface outline portions 21. Hence, there is a characteristic that the cutting process becomes easy.

Also, there is a characteristic that by adopting a structure to protect a conductive contact portion using a dust-proof or water-proof connector as the connector 30, the electronic equipment unit 11 itself can be used in an exposed state without having to be stored in a casing.

The contact terminal members 31 include contact terminals 31*a* brought into press-contact with the copper foil pattern terminals 15 via conductive elastic members 31*b*. Each of the end-face outline portions 22 is of a trapezoidal shape in cross section and has inclined portions 22*a*. When the connector 30 is attached to the end face of the multi-layer circuit board 11, intervals of the elastic members 31*b* are increased by the inclined portions 22*a*.

As has been described, in relation to a fourth aspect of the invention, the multi-layer circuit board 11 includes the end-face outline portion 22 of a trapezoidal shape in cross section in the end face in which the connector 30 is inserted. Each contact terminal member 31 includes the elastic member 31*b*.

Hence, there is a characteristic that the connector 30 can be readily inserted and damage on the end face of the multi-layer circuit board 11 due to insertion and extraction of the connector 30 can be prevented.

The multi-layer circuit board 11 includes an edge-cut substrate 40 cut in a latter step. All of a plurality of the copper foil pattern terminals 15 are connected to a common connection pattern 42 provided inside the edge-cut substrate 40 via a separate inner layer pattern 41. The edge-cut substrate 40 is cut at a region of the inner pattern 41 and removed after gold plating is applied using an electrolytic plating electrode terminal 43 provided to the connection pattern 42.

As has been described, in relation to a fifth aspect of the invention, gold plating is applied to a plurality of the copper foil pattern terminals 15 using the connection pattern 42 and the electrolytic plating electrode terminal 43 both provided to the edge-cut substrate 40 cut and removed in a latter step.

Hence, there is a characteristic that all of a plurality of the copper foil pattern terminals 15 can be readily connected to the electrolytic plating electrode terminal 43 and corrosion of the cut end face of the inner layer pattern 41 can be prevented by encapsulation with the end-face outline portions 22 formed of the encapsulation resin 20 provided in a latter step.

Second Embodiment (1) Detailed Description of Configuration and Function

Hereinafter, a configuration of a manufacturing mold assembly according to one embodiment of the invention will be described in detail by referring to FIG. 7 which is a cross section showing a state when an electronic equipment unit of a second embodiment is mounted on the manufacturing mold assembly.

Figure 7:
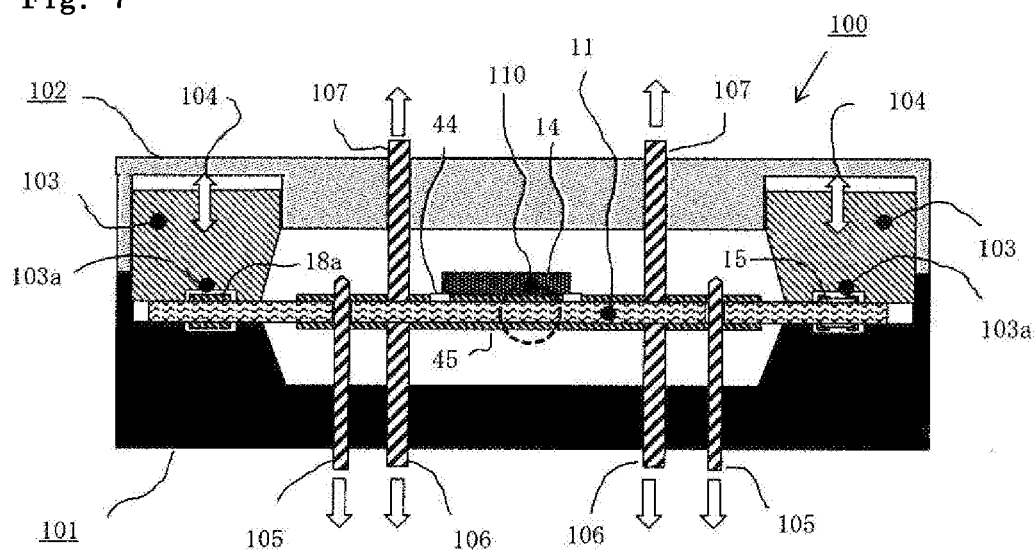
FIG. 7 is a cross section showing a state when an electronic equipment unit is mounted on a manufacturing mold assembly according to a second embodiment of the invention.

FIG. 7 shows a cross section in a case where the copper foil pattern terminals 15 are provided to both ends of the multi-layer circuit board 11. The left of FIG. 7 shows a cross section at a position of the solder resist film 18a of FIG. 1 and the right of FIG. 7 shows a cross section at a position of the copper foil pattern terminals 15 of FIG. 1.

Referring to FIG. 7, the multi-layer circuit board 11, on which the circuit parts 14 are mounted and which is finished with gold plating to the copper foil pattern terminals 15 and outer shape cutting processing, is mounted on a mating surface of a lower mold 101 and an upper mold 102 which together form a manufacturing mold assembly 100.

Movable molds 103 are provided at both end positions of the upper and lower molds 102 and 101. Each movable mold 103 has a terminal relief recess 103a and prevents the encapsulation resin 20 from flowing into the card edge terminal region 18 by allowing the peripheral portion of the terminal relief recess 103a to abut on the clamp abutting surface 19d (see FIG. 3) provided along the card edge terminal region 18.

A board thickness adjusting mechanism 104, which is a board thickness adjusting mechanism serving as an air pressure or liquid pressure adjusting mechanism or a pressing elastic member, is equipped to at least one of the movable molds 103 provided to the lower mold 101 and the upper mold 102. Hence, even when the thickness of the multi-layer circuit board 11 varies due to a difference from one individual to another, the movable mold 103 abuts on the clamp abutting surface 19d of the multi-layer circuit board 11 at a predetermined pressure. The occurrence of a leakage of resin into the card edge terminal region 18 is thus prevented.

The lower mold 101 is provided with positioning pins 105 and 105 which stand upright and fit into the reference holes 12 and 12 (see FIG. 1) provided to the multi-layer circuit board 11 at diagonal positions. The positioning pins 105 and 105 are pulled out from the lower mold 101 before the encapsulation resin 20 cures and returned and set again to a predetermined position indicated in the drawing before the next multi-layer circuit board 11 before molding is mounted.

A plurality of lower board temporary fixing pins 106 provided to the lower mold 101 and a plurality of upper board temporary fixing pins 107 provided to the upper mold 102 fixedly hold the mounted multi-layer circuit board 11 within the mold by pressing against each other at a predetermined pressure, respectively, from the board back surface and front surface. The lower board temporary fixing pins 106 and the upper board temporary fixing pins 107 are pulled out, respectively, from the lower mold 101 and the upper mold 102 before the encapsulation resin 20 cures and returned and set again to respective predetermined positions indicated in the drawing before the next multi-layer circuit board 11 before molding is mounted.

The lower board temporary fixing pins 106 and the upper board temporary fixing pins 107 are arranged so that the both press the non-solder resist region 19 of the multi-layer circuit board 11.

Injection of the encapsulation resin 20 will now be described.

Heat-curable resin melted by heating is press-injected from an injection port 110 of the mold and filled to the upper and lower surfaces and outer peripheral end faces of the multi-layer circuit board 11. It should be noted that the clamp abutting surface 19d (see FIG. 3) is provided so as to prevent the heat-curable resin from flowing into the terminal relief recess 103a of the movable mold 103.

The positioning pins 105 and the lower and upper board temporary fixing pins 106 and 107 are pulled out before the encapsulation resin 20 cures so that the resulting cavities are closed by letting the encapsulation resin 20 flow into the cavities.

In a case where the copper foil pattern terminals 15 are provided, for example, only to the right side of the multi-layer circuit board 11, the movable mold 103 on the left is omitted and a pair of the lower board temporary fixing pin 106 and the upper board temporary fixing pin 107 is moved and set at this position instead.

(2) Main Points and Characteristics of Second Embodiment

As is obvious from the description above, the manufacturing mold assembly 100 of the electronic equipment unit 10 according to the second embodiment of the invention is configured in such a manner so as to: pinch, between a pair of a lower mold 101 and an upper mold 102 opposing each other, the multi-layer circuit board 11 including a plurality of the circuit parts 14 mounted in the part arrangement region 16, the non-solder resist region 19 provided on an outer side of the part arrangement region 16, and the card edge terminal region 18 in which a plurality of the copper foil pattern terminals 15 are formed and which is provided to at least one of two sides on an outer side of the non-solder resist region 19; and integrally mold the multi-layer circuit board 11 and a plurality of the circuit parts 14 except for the card edge terminal region 18 with the encapsulation resin 20 by press-injecting heat-curable resin melted by heating from an injection port 110 provided to a boundary surface. A movable mold 103 is provided to at least one of the lower mold 101 and the upper mold 102 and the movable mold 103 includes a terminal relief recess 103a to prevent the encapsulation resin 20 from flowing into the card edge terminal region 18 and presses the clamp abutting surface 19d of the multi-layer circuit board 11 using an outer peripheral portion of the terminal relief recess 103a via a board thickness adjusting mechanism 104. The board thickness adjusting mechanism 104 includes one of an air pressure adjusting mechanism, a liquid pressure adjusting mechanism, and a pressing elastic member to maintain a constant pressing pressure even when a thickness dimension of the multi-layer circuit board 11 varies.

The encapsulation resin 20 communicates with side-surface outline portions 21, end-face outline portions 22, and an intermediate outline portion 23 in peripheral end-face portions of the multi-layer circuit board 11. The lower mold 101 is provided with positioning pins 105 and 105 which stand upright and fit into reference holes 12 and 12 provided to the multi-layer circuit board 11 at diagonal positions. The positioning pins 105 and 105 are pulled out from the lower mold 101 before the encapsulation resin 20 cures and returned and set again at a predetermined position before a next multi-layer circuit board 11 before molding is mounted.

As has been described, in relation to a seventh aspect of the invention, the mounting position of the multi-layer circuit board 11 is regulated by the reference holes 12 on the board side and the positioning pins 105 on the mold side, and the side-surface outline portions 21, the end-face outline portions 22, and the intermediate outline portion 23 of the encapsulation resin 20 are formed according to the mounting position thus regulated.

Hence, because the copper foil pattern terminals 15 are formed in reference to the reference holes 12 on the board side, there is a characteristic that positional accuracy between the contact terminal members 31 of the inserted connector 30 and the contact surfaces of the copper foil pattern terminals 15 can be improved and also accuracy of the relative position of the movable mold 103 with respect to the clamp abutting surface 19d can be improved.

Also, because the positioning pins 105 are pulled out from the lower mold 101 before the encapsulation resin 20 cures, there is a characteristic that no cavities are formed in the encapsulation resin 20.

A plurality of lower board temporary fixing pins 106 provided to the lower mold 101 and a plurality of upper board temporary fixing pins 107 provided to the upper mold 102 press against each other at a predetermined pressure, respectively, from a back surface and a front surface of the mounted multi-layer circuit board 11. The lower board temporary fixing pins 106 and the upper board temporary fixing pins 107 are pulled out, respectively, from the lower mold 101 and the upper mold 102 before the encapsulation resin 20 cures and returned and set again at respective predetermined positions before a next multi-layer circuit board 11 before molding is mounted. Both of the lower board temporary fixing pins 106 and the upper board temporarily fixing pins 107 press the non-solder resist region 19 of the multi-layer circuit board 11.

As has been described, in relation to an eighth aspect of the invention, the multi-layer circuit board 11 mounted inside the mold is pinched at a predetermined pressure by both of the lower board temporary fixing pins 106 and the upper board temporary fixing pins 107.

Hence, there is a characteristic that deformation of the multi-layer circuit board 11 can be prevented when resin melted by heating is press-injected, and all the regions except for the card edge terminal region 18 can be integrally molded with the encapsulation resin 20 precisely even when amounts of the encapsulation resin 20 are different between the board front and back surfaces because no solder resist film is formed at pinched positions and pressed positions are absent.

Various modifications and alterations of this invention will be apparent to those skilled in the art without departing from the scope and spirit of this invention, and it should be understood that this is not limited to the illustrative embodiments set forth herein.

What is claimed is:

1. An electronic equipment unit of a card edge terminal type including a plurality of copper foil pattern terminals pressed by external connection contact terminals in at least one of both surfaces at end portions on a first side and a second side parallel to the first side of a multi-layer circuit board, wherein:
   the multi-layer circuit board includes,
      a part arrangement region in which a plurality of circuit parts are connected with solder,
      an outline region which surrounds the part arrangement region and in which a solder resist film is formed, and
      a non-solder resist region which is further located outside of the outline region and in which formation of the solder resist film is inhibited;
   the copper foil pattern terminals connected to a plurality of the circuit parts are provided to at least one of the first side and the second side;
   a solder resist film is formed in the card edge terminal region which is a peripheral portion of the copper foil pattern terminals except for a conductive contact surface;
   the multi-layer circuit board and a plurality of the circuit parts are integrally molded with encapsulation resin which is heat-curable resin except for the card edge terminal region;
   the copper foil pattern terminals are formed on a surface layer through via holes by passing through the non-solder resist region by means of an inner layer pattern of the multi-layer circuit board; and
   a clamp abutting surface which is pressed by a mold and surrounds the card edge terminal region and thereby prevents the encapsulation resin from flowing into the card edge terminal region is a partial region of the multi-layer circuit board where a surface layer circuit pattern is absent.

2. The electronic equipment unit according to claim 1, wherein:
   the non-solder resist region is provided with at least one of two-side connection holes connecting the encapsulation resin on board front and back surfaces to each other and surface sac holes allowing the encapsulation resin on the board front and back surfaces to closely adhere to the board front and back surfaces, respectively.

3. The electronic equipment unit according to claim 1, wherein:
   the encapsulation resin extends to end-face outline portions on the first side and the second side and side-surface outline portions on a third side and a fourth side orthogonal to the first side and the second side and thereby surrounds the multi-layer circuit board along an entire circumference;
   in a case where a plurality of the copper foil pattern terminals are divided to two groups arranged on right and left sides and a cut portion is provided to the card edge terminal region of the multi-layer circuit board, an intermediate outline portion extended from the encapsulation resin is provided to an outer periphery of the cut portion;
   an external connection connector is attached to a plurality of the copper foil pattern terminals;
   the connector includes a plurality of contact terminal members which come into conductive contact with the copper foil pattern terminals and includes at least one of both-side fitting portions which fit to the side-surface outline portions and an intermediate fitting portion which fits to the intermediate outline portion; and
   positional relations of the side-surface outline portions and the intermediate outline portion with respect to a plurality of the copper foil pattern terminals are determined by using positioning reference holes provided to the multi-layer circuit board at diagonal positions as common reference points.

4. The electronic equipment unit according to claim 3, wherein:
   the contact terminal members include contact terminals brought into press-contact with the copper foil pattern terminals via conductive elastic members;
   each of the end-face outline portions is of a trapezoidal shape in cross section and has inclined portions; and
   when the connector is attached to the end face of the multi-layer circuit board, intervals of the elastic members are increased by the inclined portions.

5. The electronic equipment unit according to claim 3, wherein:
   the multi-layer circuit board includes an edge-cut substrate cut in a latter step;

all of a plurality of the copper foil pattern terminals are connected to a common connection pattern provided inside the edge-cut substrate via a separate inner layer pattern; and the edge-cut substrate is cut at a region of the inner layer pattern and removed after gold plating is applied using an electrolytic plating electrode terminal provided to the connection pattern.

6. A manufacturing mold assembly for the electronic equipment unit, configured in such a manner so as to:

pinch, between a pair of a lower mold and an upper mold opposing each other, the multi-layer circuit board including a plurality of the circuit parts mounted in the part arrangement region, the non-solder resist region provided on an outer side of the part arrangement region, and the card edge terminal region in which a plurality of the copper foil pattern terminals are formed and which is provided to at least one of two sides on an outer side of the non-solder resist region; and integrally mold the multi-layer circuit board and a plurality of the circuit parts except for the card edge terminal region with the encapsulation resin by press-injecting heat-curable resin melted by heating from an injection port provided to a boundary surface, wherein:

a movable mold is provided to at least one of the lower mold and the upper mold;

the movable mold includes a terminal relief recess to prevent the encapsulation resin from flowing into the card edge terminal region and presses the clamp abutting surface of the multi-layer circuit board using an outer peripheral portion of the terminal relief recess via a board thickness adjusting mechanism; and the board thickness adjusting mechanism includes one of an air pressure adjusting mechanism, a liquid pressure adjusting mechanism, and a pressing elastic member to maintain a constant pressing pressure even when a thickness dimension of the multi-layer circuit board varies.

7. The manufacturing mold assembly of the electronic equipment unit according to claim 6, wherein:

the encapsulation resin communicates with side-surface outline portions, end-face outline portions, and an intermediate outline portion in peripheral end-face portions of the multi-layer circuit board;

the lower mold is provided with positioning pins which stand upright and fit into reference holes provided to the multi-layer circuit board at diagonal positions; and the positioning pins are pulled out from the lower mold before the encapsulation resin cures and returned and set at a predetermined position before a next multi-layer circuit board before molding is mounted.

8. The manufacturing mold assembly of the electronic equipment unit according to claim 6, wherein:

a plurality of lower board temporary fixing pins provided to the lower mold and a plurality of upper board temporary fixing pins provided to the upper mold press against each other at a predetermined pressure, respectively, from a back surface and a front surface of the mounted multi-layer circuit board;

the lower board temporary fixing pins and the upper board temporary fixing pins are pulled out, respectively, from the lower mold and the upper mold before the encapsulation resin cures and returned and set again at respective predetermined positions before a next multi-layer circuit board before molding is mounted; and both of the lower board temporary fixing pins and the upper board temporarily fixing pins press the non-solder resist region of the multi-layer circuit board.

* * * * *